United States Patent [19]

Opie

[11] Patent Number: 4,743,780
[45] Date of Patent: May 10, 1988

[54] PULSE GENERATOR WITH SHIELDED WIEGAND WIRE

[75] Inventor: John E. Opie, Stony Creek, Conn.

[73] Assignee: Echlin Inc., Branford, Conn.

[21] Appl. No.: 38,010

[22] Filed: Apr. 14, 1987

[51] Int. Cl.$^4$ ................................................. H03K 3/45
[52] U.S. Cl. ...................................... 307/419; 307/106; 360/110; 360/125; 365/133
[58] Field of Search ............... 307/105, 106, 107, 108, 307/109, 110, 410, 411, 412, 413, 415, 418, 419; 360/84, 107, 110, 112, 115, 118, 123, 125; 365/133; 310/155, 156; 324/173, 174, 179, 180

[56] References Cited

U.S. PATENT DOCUMENTS

| | | | |
|---|---|---|---|
| 3,105,965 | 10/1963 | Joannou | 360/118 X |
| 3,780,313 | 12/1973 | Wiegand | 307/106 |
| 3,875,545 | 4/1975 | Curtiss | 336/110 |
| 4,120,011 | 10/1978 | Kolb | 360/125 X |
| 4,123,790 | 10/1978 | Moeller et al. | 360/125 X |
| 4,247,601 | 1/1981 | Wiegand | 428/611 |
| 4,263,523 | 4/1981 | Wiegand | 307/419 |
| 4,309,628 | 1/1982 | Wiegand | 307/419 |
| 4,484,090 | 11/1984 | Wiegand et al. | 307/419 |
| 4,509,084 | 4/1985 | Fujioka et al. | 360/110 X |
| 4,593,209 | 6/1986 | Sloan | 365/133 X |

Primary Examiner—William M. Shoop, Jr.
Assistant Examiner—Paul Ip
Attorney, Agent, or Firm—McAulay, Fields, Fisher, Goldstein & Nissen

[57] ABSTRACT

A pulse generating unit in which a Wiegand wire module is contained within two soft iron ferromagnetic members which act as shunts in that they collect, conduct and guide flux incident on the pulse generating unit toward an air gap between the two shunt elements. the air gap is approximately at the center of the Wiegand wire module. Cylindrical cavities in these two shunt elements shield the ends of the Wiegand wire thereby minimizing the incidence of external flux on the Wiegand wire. Saturation of the flux at the air gap between the two shunts causes leakage of flux to be available to switch the state of the Wiegand wire.

8 Claims, 5 Drawing Sheets

PULSE GENERATOR WITH SHIELDED WIEGAND WIRE

BACKGROUND OF THE INVENTION

This invention relates in general to a pulser for generating a pulse by switching the state of a magnetic device that has come to be known as a Wiegand wire and, more particularly, to a mechanism and method for controlling the magnetic field to which a Wiegand wire module is subjected so as to provide an improved output pulse.

The magnetic device employing the pulser of this invention is of the type disclosed in U.S. Pat. No. 4,247,601 issued Jan. 27, 1981. This magnetic device is a ferro-magnetic wire segment which has been treated to provide core and shell portions with divergent magnetic properties. The wire is now known in the art as a Wiegand wire.

The Wiegand wire essentially has two states. In one of these states, the magnetization of the core and shell are in opposite directions and this state may conveniently be called a reverse state. In the other state, the magnetization of the core and shell are in the same direction and this state may conveniently be called the confluent state. When the magnetic field to which the wire is subjected passes a threshold in one direction or the other, the wire switches state. The switch in state is extremely rapid so that the rate of change of flux through a pick-up coil wrapped around the wire is great. As a consequence the output from the pick-up coil is very substantial, in some cases being as high as eight volts into an open circuit on a repeatable basis. The wire and pick-up coil is referred to as a module.

The characteristics of a pulse generator which are desirable include simplicity, low cost, versatility, repeatability, reliability and high output pulse. There are inevitably certain trade-offs in enhancing certain of these characteristics at the expense of other characteristics. However, it is desirable to provide an optimum combination of these characteristics with whatever enhancement of the characteristics may be achieved in an improved design and such is the general purpose of this invention.

U.S. Pat. No. 4,484,090 entitled Pulsed Generator With Shaped Magnetic Field issued Nov. 20, 1984 discusses the problem that arises because of the demagnetization field at the ends of the Wiegand wire. That patent discloses a pulser in which the excitation field is shaped so as to minimize the axial field at the ends of the wire thereby minimizing the effects of the demagnetization field at the end of the wire. This shaped field design provides an improved pulser in that the more rapid switch in flux when the demagnetization field is minimized provides a larger output pulse in the pickup coil than is the case when the field at the ends of the wire is significant. The increased pulse magnitude provided by the shaped field design disclosed in this patent serves to enhance the utility of the pulser. However, it has been found that the improvement provided is not as consistent and repeatable as is desirable in operating equipment. In particular, the effects of ambient fields and, most particularly, changing ambient fields results in a loss of repeatability and consistent pulse output magnitude.

Accordingly, it is a purpose of this invention to provide a pulser in which the enhanced output pulse obtained by a shaped magnetic field is provided in a repeatable and consistent fashion.

It is a related purpose of this invention to provide such a pulser as will be tolerant to variations in the geometric configuration and strength of the excitation field and yet provide a repeatable and consistent output pulse.

BRIEF DESCRIPTION

The pulse generating unit of this invention involves a Wiegand wire module mounted within two soft ferromagnetic shunt elements. These two shunt elements perform two major functions. The first function is to magnetically shield the two ends of the Wiegand wire module so as to substantially eliminate the known end demagnetization effect which reduces the output pulse when the Wiegand wire switches state. This is achieved by having small cylindrical cavity elements within each of the two shunts into which cavity elements the ends of the Wiegand wire module are mounted. The second major function is to collect, conduct and guide incident flux from an adjacent drive magnet in such a fashion as to direct the flux across an air gap between the two shunt elements. The result is to assure that there will be enough leakage flux to drive the Wiegand wire and thus cause it to change state. The change of state of the Wiegand wire provides a rapid change in the flux coupled through the pick-up coil on the module thereby producing a significant and usable output pulse. This pulser unit when combined with a movable magnet that upon motion is coupled and uncoupled to the Wiegand wire, provides a device that can be used as a proximity measuring device, a speed measuring device or a position measuring device.

BRIEF DESCRIPTION OF THE FIGURES

FIGS. 1A and 1B show details of the FIG. 1 device.

DESCRIPTION OF THE PREFERRED EMBODIMENT

Figure 1:
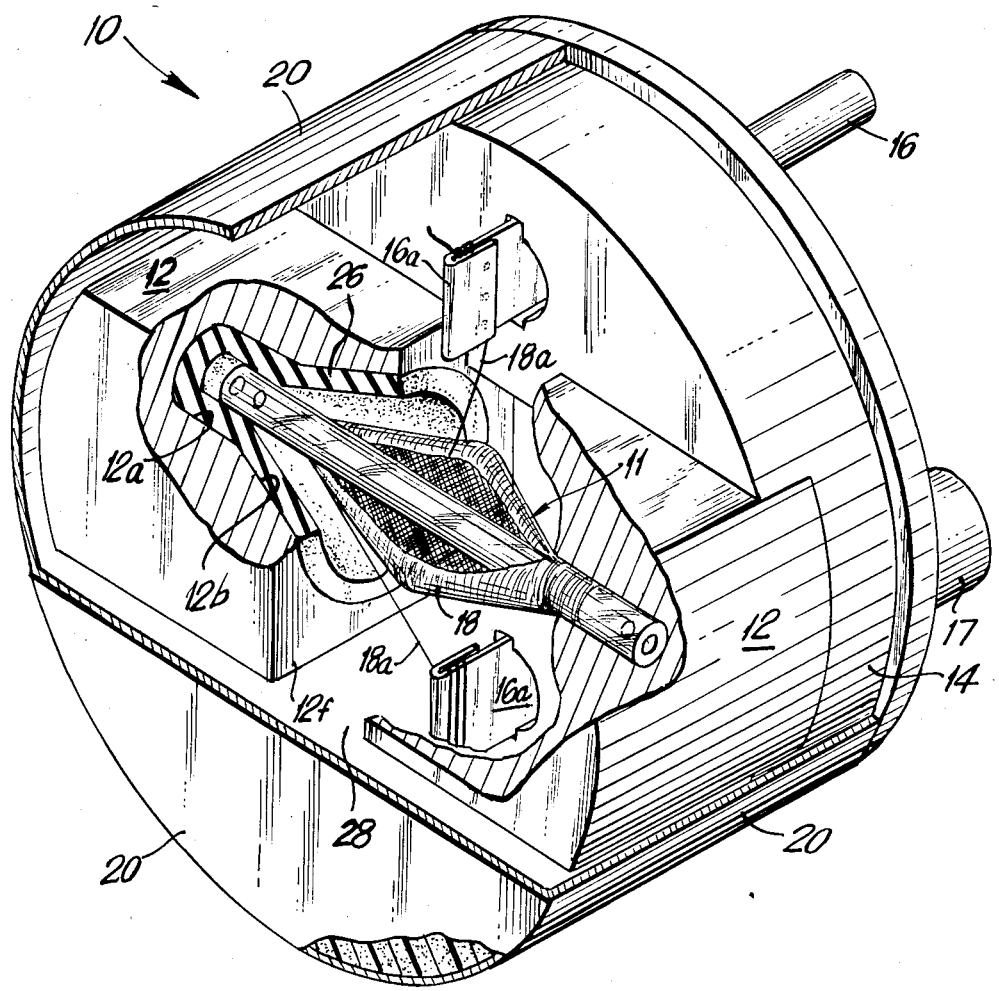
FIG. 1 is a cut-away perspective view of one embodiment of this invention showing the ferromagnetic shunts 12 within which is contained the module 11 that constitutes the Wiegand wire and pickup coil.
Figure 2:
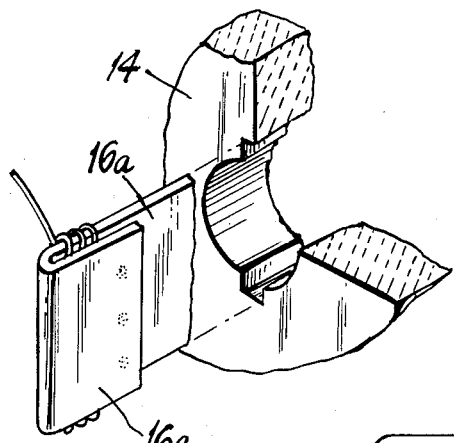
FIG. 2 is a longitudinal sectional view of the module 11 showing the elliptical pick-up coil 18.
Figure 2:
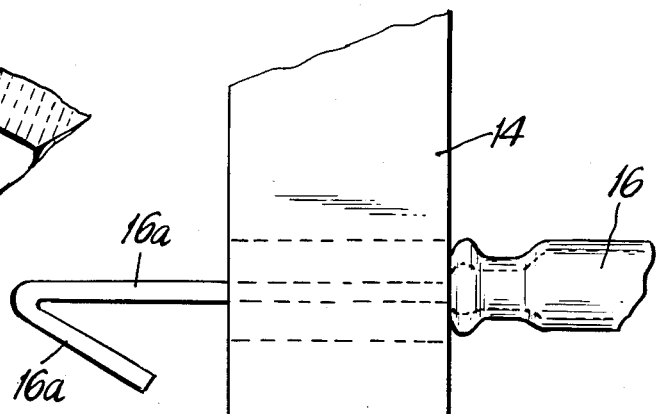
Figure 2:
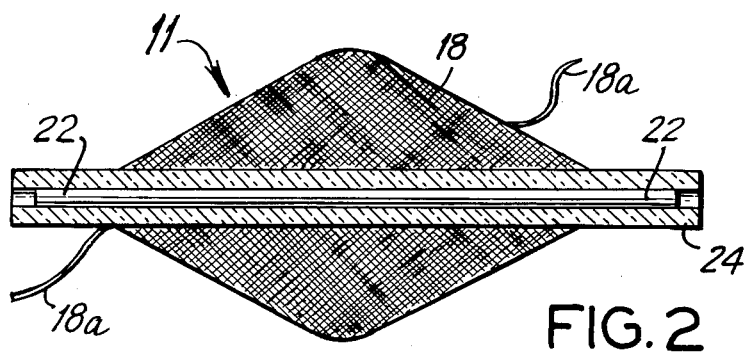
Figure 3B:
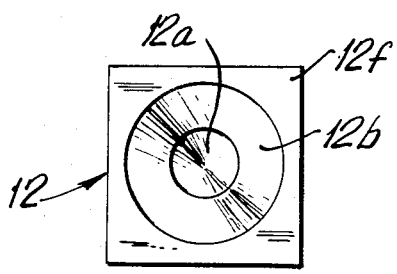
FIGS. 3A and 3B are sectional and end views of one of the shunts 12.
Figure 3A:
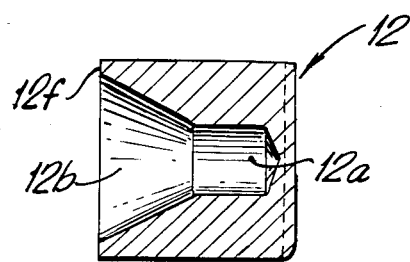

As shown in the figures, the pulser 10 includes a Wiegand wire module 11 mounted within a cavity that is defined by two magnetically soft ferromagnetic shunt elements 12. The module 11 and both shunts 12 are held on a molded plastic base 14. Two terminals 16 (only one is shown) extend through the base 14 and are connected to the ends of the pick-up coil 18 that is a part of the module 11. A stainless steel cap 20 fits over the shunt elements 12 and the periphery of the base 14. The base 14 includes a short positioning lug 17 to aid in orienting the pulser when assembling it onto other equipment.

The module 11 consists of (a) a Wiegand wire element 22 held within a glass tube 24 and (b) the pick-up coil 18 wound around the central portion of the glass tube 24. The coil 18 is coupled to the changing magnetic field produced by the switch in the magnetic state of the Wiegand wire 22. The ends of the glass tube 24, and thus the ends of the Wiegand wire 22, are mounted in shallow cylindrical recesses 12a of the shunt elements 12. Rubber end caps 26 are positioned over the ends of glass tube 24 and fit within the cylindrical recesses 12a so as to provide a firm, resilient and safe mount for the glass tube 24. These end caps 26 extend inboard along the conical walls of the cavity in the shunt 12. Only one end cap 26 is shown. The break away view eliminates the other cap.

The cavity within each shunt element 12 is defined by the cylindrical recess 12a at the outboard ends of each cavity and by the truncated conical zone 12b which is inboard from the cylindrical recess 12a. The conical cavity zone 12b has its smallest diameter at the cylindrical recess 12a and increases in diameter to the central face 12f of the shunt element 12. The central faces 12f of the two shunt elements 12 are spaced from one another thereby establishing a small gap 28 between the two shunt elements 12.

Lead wires 18a from the pick-up coil 18 are wrapped around a folded over terminal end 16a which is crimped and welded to hold the lead wires 18a in place and assure good electrical contact. The terminal 16 is a cylindrical terminal that extends through the plastic base 14 and has the flat end 16a. Accordingly, an output pulse generated in the pick-up coil 18 will be transmitted to the terminal 16.

Figure 4:
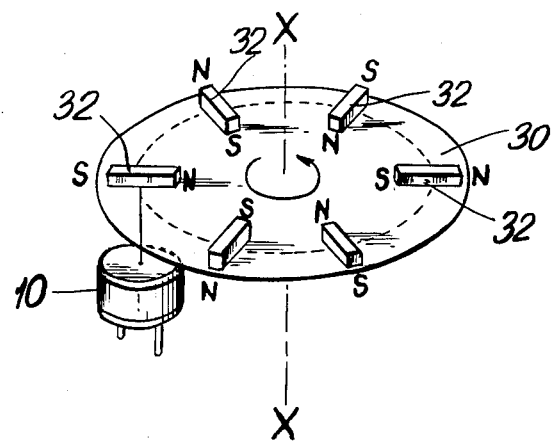
FIG. 4 is a schematic representation of a speed sensor device using the FIG. 1 pulser 10 in which output pulses are obtained by an excitation field provided by magnets 32 on a rotating disc 30.

As shown in FIG. 4, the pulser 10 may be magnetically driven by a set of magnets 32 mounted on the periphery of a rotatable disc 30. When the disc 30 is coupled to a rotating device, the disc 30 and pulser 10 provide a set of output pulses which measure the rotational speed of the device. As each magnet 32 passes over the top of the cap 20, it is magnetically coupled to the Wiegand wire 22 thereby causing the Wiegand wire 22 to switch state. This state switch generates an output pulse in the pick-up coil 18.

An hypothesis as to the operation of the Wiegand wire 22 has been described in the referenced patents and those descriptions are incorporated herein. A repetition of that discussion need not be engaged in at this point. Suffice it to state that when a strong enough external magnetic field approaches, such as the field provided by a magnet 32, the magnet captures the entire Wiegand wire forcing the Wiegand wire into what has been called a set state or confluent state. A state change in the wire occurs when the external field reverses direction. Each change of state of the Wiegand wire occurs very rapidly. Because it occurs very rapidly, the change in the pattern of the magnetic flux adjacent to the Wiegand wire changes very rapidly. This rapid rate of change of flux with time is sensed by the pick-up coil 18 to provide an output pulse.

Operation of the Pulser

The magnets 32 pass over the top of the FIG. 1 pulser unit 10 with the axis of each magnet 32 in alignment with the axis of the Wiegand wire 22. The wire 22 switches state and a substantial output pulse is provided (see FIG. 4A). The position and configuration of the shunt elements 12 shape and control the magnetic field to which the Wiegand wire 22 is subjected in a fashion which optimizes the operation of the Wiegand wire segment 22. The conical or funnel shaped cavity area 12b conducts the flux from the exciting magnet 32 axially toward the air gap 28 between the elements 12. The ends of the wire 22 are substantially shielded from the external flux. In part, this is due to the fact that the ends of the wire 22 are spaced from the air gap 28 and, perhaps more importantly, because the greater volume of the shunt element 12 immediately adjacent to the ends of the wire 22 serves to carry incident flux inboard toward the air gap 28. In this fashion, a substantially zero magnitude field at the ends of the Wiegand wire serves to substantially reduce or eliminate the demagnetization end effects which have been observed in connection with the switching of a Wiegand wire. The result is a larger output pulse from the module 10 than is achieved where these demagnetization end effects exist. This end effect phenomenon has been observed, although it is not entirely understood as to why it occurs. U.S. Pat. No. 4,484,090 is directed to a prior art technique of minimizing these end effects in a pulser. However, what has been found is that a much more consistent and somewhat greater output pulse can be obtained with the device of this invention. Part of the reason is believed to be that the shunt elements 12 serve to shield the ends of the wire from all stray magnetic effects.

The shunt elements 12 are a soft ferromagnetic material. In one embodiment, they are a powdered iron of magnetic grade and provide a low reluctance path for the magnetic field generated by the magnet 32. The cap 20, being of stainless steel material, is transparent to the magnetic flux and thus has no effect on the magnetic operation of this pulse generator unit 10.

Figure 4A:
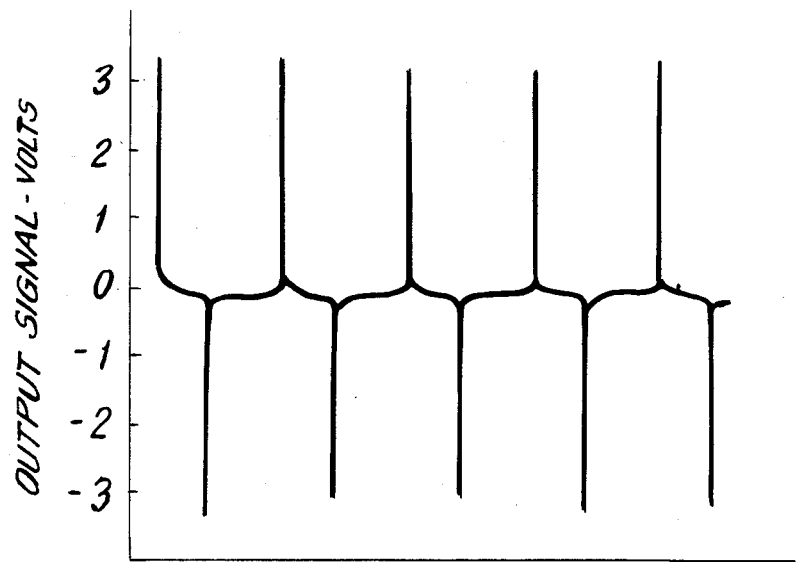
FIG. 4A illustrates the output pulse train obtained from the FIG. 4 device.

The pulser unit 10 of FIG. 1 may be actuated by a rotating disk 30, as shown in FIG. 4. The disk 30 has a series of magnets 32 of alternating polarity, as shown. A first one of the magnets 32 will magnetize the Wiegand wire 22 in a first direction and in doing so will provide a first output pulse. As the first magnet rotates away from the pulser unit, a second magnet 32 having opposite polarity will drive the Wiegand wire into an opposing magnetic polarity and will generate a second pulse. The pulses generated by alternate magnets in the FIG. 4 embodiment will be of opposite polarity. A waveform of the output pulse train from the FIG. 4 arrangement is shown in FIG. 4A.

What has been observed about the FIG. 1 design is that it is very forgiving of alignment and spacing variations between the actuating magnet 32 and the pulser unit 10. Thus, if the axis of the exciting magnet 32 is not parallel to the axis of the Wiegand wire 22, the pulser 10 will operate to provide the output pulse. Similarly, if the spacing between the magnet 32 and the pulser unit 10 varies, the desired output pulse will be obtained. The shunt elements 12 serve to collect, conduct, and guide the incident flux from the magnet 32 in such as fashion as to concentrate this flux across the gap 28 in a direction that is parallel to the axis of the Wiegand wire 22. This concentration of flux saturates the air gap between the shunts 12 thereby creating enough leakage flux to subject the Wiegand wire 22 to an optimal excitation field.

In brief, the shunts 12 provide both a magnetic shielding function for the ends of the Wiegand wire and a magnetic flux ducting function to facilitate switching.

In one specific embodiment of this invention which has been constructed and tested, a glass tube 24 approximately 1.1 cm long contains a Wiegand wire segment 22 that is approximately 1 cm in length. Wire 22 has a diameter of approximately one-quarter millimeter and it is slipped into the tube 24 which has an outer diameter of approximately 1 mm and an inner diameter of approximately 0.38 mm. The wire need not be fastened inside the tube because the two end-caps 26 prevent the wire from falling out. The coil 18 has 2,000 turns of No. 44 magnet wire and it is positioned on the center 7 mm of the tube 24. Approximately 2 mm of each end of the tube 24 is contained in the cap portion of the rubber endcap 26. Each shunt element 12 is made out of magnetic grade powdered iron and has an overall length of approximately 6.3 mm and square sides of approximately 6.3 mm. The axial length of the two cavities 12a and 12b is approximately 5 mm and the axial length of the cavity 12b is approximately 2.8 mm. The gap 28 between the two shunt faces 12f is approximately 2.54 mm.

The Hysteresis Curves

The application of a drive field to only the center portion of a Wiegand wire segment is called herein the short drive field to contrast it with the long field arrangement which has been used in the past for Wiegand wire switching. In a long field arrangement, the drive field may be created by a solenoid with the Wiegand wire positioned in the center of the solenoid and the ends of the wire well within the solenoid. That long solenoid drive field is analogous to the excitation of the Wiegand wire by a magnet passing the wire where the field of the magnet affects the ends of the wire.

By contrast, the two shunt elements 12 provide a short field in that only the center of the wire 22 is subject to the drive field.

FIGS. 5A, 5B, 6A and 6B contrast the hysteresis curves obtained by exciting the Wiegand wire in a long field and in a short field, in symmetric drive and in asymmetric drive. The drive refers to the field imposed on the Wiegand wire by an external source such as a solenoid or a magnet. It should be noted that the long drive field arrangement which has been extensively employed, provides a switching model that does not adequately explain the results of the short drive field. As described in the referenced patents, and in other patents, the switching state of the Wiegand wire produces a change in the field around the wire which can be sensed by a pick-up coil to provide an output pulse. Because this change of state occurs rapidly, the rate of change of flux with time is significant enough to provide a meaningful output pulse.

In the long symmetric drive field situation, it was noted that as the field went more positive so as to force the core into the same direction of magnetization as the shell a first very small pulse could be detected. That pulse occurs in the region 51 shown in FIG. 5A as the wire switches from a reverse state to a confluent state. When the drive field is reduced, at a small negative field (about 10 Oersteds) the shell is able to recapture the core and the wire switches from its confluent state to a reverse state and a more significant output pulse is provided at the zone 52 on the hysteresis curve of FIG. 5A. Further driving the excitation field negative to about minus 60 Oersteds creates another small output pulse at the zone 53 where the wire switches from reverse state to confluent state. In the confluent state, past zone 53 the direction of magnetization of the core and shell are the same but they are in the reverse direction from the direction when they are in the confluent state past the zone 51. Reduction of the absolute magnitude of the negative field causes the wire to switch state at the zone 54 from confluent state to reverse state when the exciting field goes slightly positive. This produces an output pulse. This model in which the exciting field and the shell field compete with one another to capture the core as the means for explaining these four switching zones 51, 52, 53 and 54 has only limited value in explaining what happens in the other drive situations.

Figure 6A:
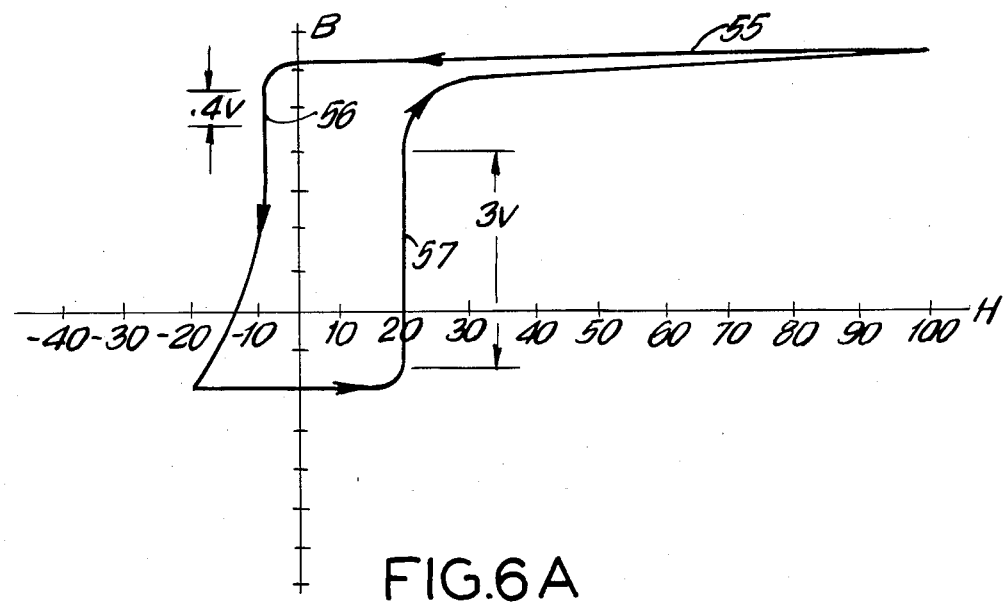
FIG. 6A illustrates a hysteresis curve of a prior art pulser where the Wiegand wire is subject to a long excitation field applied as an asymmetric drive.

FIG. 6A illustrates what happens under asymmetric drive employing the long drive field. A strong positive drive field forces core and shell into the same magnetization. There is no comparable negative (opposite direction) field applied. The asymmetric drive results in asymmetric pulses. Essentially, after the strong excitation field, at the zone 55 of FIG. 6A, has created a confluent state for the wire, the decrease in the magnitude of the excitation field to a small negative value, as the zone 56, produces the relatively small output pulse similar to that shown in FIG. 5A when the wire switches from its confluent state to its reverse state. By not taking the wire to the point where a negative confluent state is created, an interesting thing occurs that provides a much stronger output pulse. Specifically, by bringing the excitation field in a positive going direction while the wire is still in its reverse state, a much sharper output pulse is obtained at the zone 57 when the wire switches from its reverse state to its positive going confluent state. The result is to provide a much more substantial and thus more usable output pulse. Because of this higher amplitude pulse obtained by the switching at zone 57, the long field asymmetric drive became preferred over the long field symmetric drive and asymmetric drive became the standard drive used in commercial applications.

However, for most applications of a pulser device, it would be preferable to have symmetric drive in which alternate positive and negative going pulses would be provided. Such provides twice the number of pulses per hysteresis cycle.

Figure 5A:
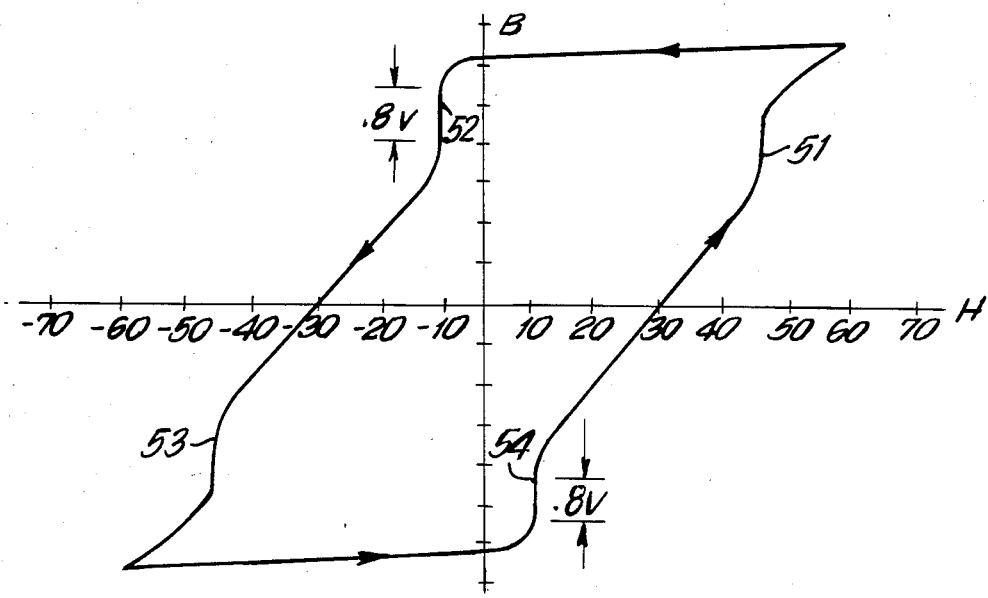
FIG. 5A illustrates a hysteresis curve of a prior art pulser where the Wiegand wire is subject to a long excitation field applied as a symmetric drive.
Figure 5B:
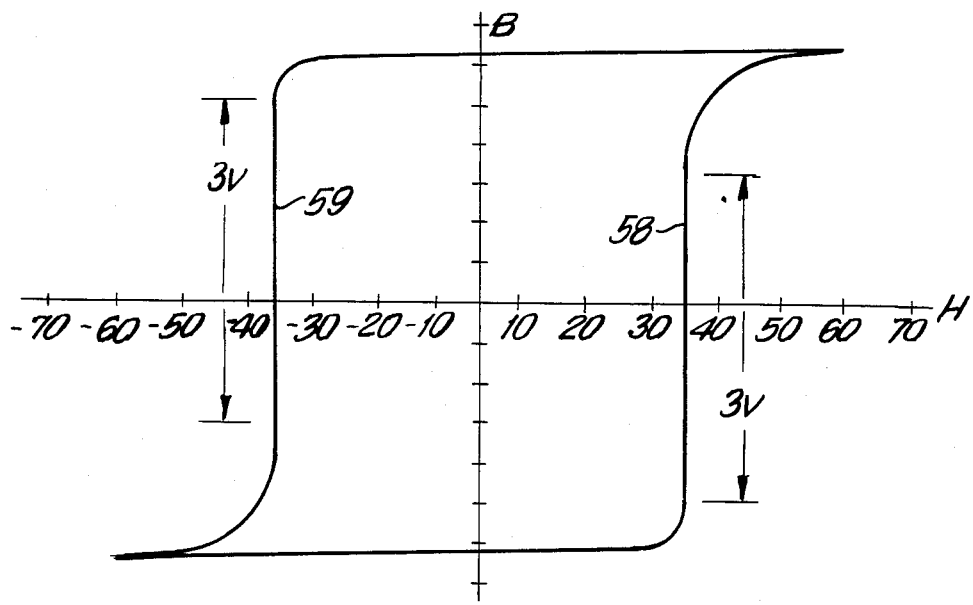
FIG. 5B shows the contrasting hysteresis curve typical of the FIG. 1 pulser wherein the Wiegand wire is subject to a short excitation field applied as a symmetric drive.
Figure 6B:
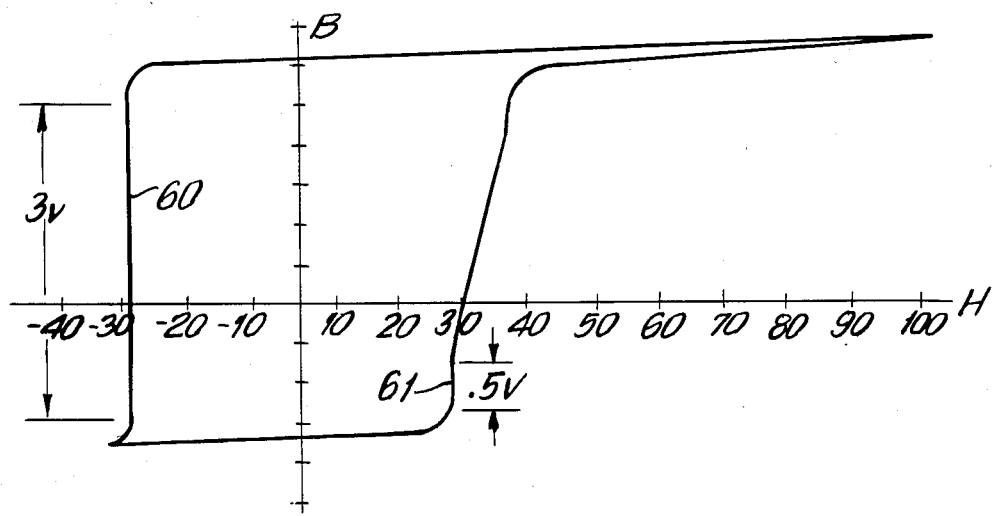
FIG. 6B shows the contrasting hysteresis curve typical of the FIG. 1 pulser wherein the Wiegand wire is subject to a short excitation field applied as an asymmetric drive.

Accordingly, one of the advantages of this invention involving an effective, repeatable short field drive is that it makes possible the symmetric drive arrangement with the two substantial pulses per cycle, at zones 58 and 59 as shown in FIG. 5B. It is believed that the underlying reason for the substantial pulse developed at 57 in FIG. 6A is the same as the reason for the substantial pulses developed at 58 and 59 in FIG. 5B. However, it is not clear why these substantial pulses are created under these conditions. It is notable that the short field asymmetric drive provides a hysteresis curve as shown at FIG. 6B in which the substantial output pulse occurs at the zone 60. It is not known why the single substantial pulse per cycle provided by asymmetric drive should appear at different places in the long field and short field hysteresis loops.

What is claimed is:

1. A pulser for use in the generation of a pulse in response to a changing magnetic field comprising:
   a Wiegand wire module including a Wiegand wire segment and a pick-up coil wound on said segment, said module having first and second end portions,
   ferro-magnetic shunt means surrounding at least first and second ends of said module, said shunt means including a high reluctance zone adjacent to the center of said module and a lower reluctance zone adjacent to the ends of said module,
   said shunt means being shaped to collect and guide flux that is incident on said pulser to said high reluctance zone causing leakage flux to be coupled to the center portion of said Wiegand wire.

2. The pulser of claim 1 wherein:
   said shunt means includes first and second elements spaced from one another to provide an air gap as said high reluctance zone,
   each of said shunt means has a cavity, the outboard ends of said cavities encompassing said first and second ends of said module.

3. The pulser of claim 2 wherein: said cavity of each of said shunt elements is greater in cross sectional area adjacent said center portion of said module and lesser in cross sectional area adjacent an end portion of said module.

4. The pulser of claim 3 wherein:
   said pick-up coil is wound on a center portion of said wire, the ends of said wire extending out of said coil, said cavity of each of said shunt elements includes a cylindrical recess for retaining an end of said wire.

5. The pulser of claim 4 wherein: the center portion of said cavity of each of said shunt elements increases smoothly in cross sectional area inboard of said cylindrical recess along the axis of said wire.

6. The pulser of claim 5 wherein: the cavity of each of said shunt elements defines an approximate truncated cone inboard of said cylindrical end segment.

7. The pulser of claim 6 wherein: said pick-up coil is shaped to fit within the space defined by the combined cavities of said shunt elements.

8. A sensor device comprising:
   a pulser unit,
   a magnet unit, and
   means for moving said pulser and magnet units into and out of proximity with one another,
   said pulser unit including:
   (a) a Wiegand wire module including a Wiegand wire segment and a pick-up coil wound on said segment, said module having first and second end portions,
   (b) ferro-magnetic shunt means surrounding at least first and second ends of said module, said shunt means including a high reluctance zone adjacent to the center of said module and a lower reluctance zone adjacent to the ends of said module,
   (c) said shunt means being shaped to collect and guide flux that is incident on said pulser to said high reluctance zone causing leakage flux to be coupled to the center portion of said Wiegand wire,
   said magnet including at least one magnet and a support for said magnet.

* * * * *